US 6,591,494 B2

(12) United States Patent
Okamura et al.

(10) Patent No.: US 6,591,494 B2
(45) Date of Patent: Jul. 15, 2003

(54) METHOD FOR MANUFACTURING A NON-CONTACT TYPE IC CARD

(75) Inventors: Shigeru Okamura, Nagano (JP); Tomoharu Fujii, Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 38 days.

(21) Appl. No.: 09/940,566

(22) Filed: Aug. 28, 2001

(65) Prior Publication Data

US 2002/0023964 A1 Feb. 28, 2002

(30) Foreign Application Priority Data

Aug. 31, 2000 (JP) ........................................ 2000-263837

(51) Int. Cl.⁷ ................................................ H05K 3/30
(52) U.S. Cl. .............................. 29/832; 29/605; 29/606; 235/492; 343/895; 361/782; 361/737; 257/679
(58) Field of Search ........................... 29/605, 606, 832, 29/847, 846, 854; 216/13, 15, 75, 77, 78, 100, 101, 102, 105; 235/492, 441, 488; 343/895; 174/250, 261; 361/782, 737; 257/679

(56) References Cited

U.S. PATENT DOCUMENTS 5,272,326 A * 12/1993 Fujita .......................... 235/487
5,598,032 A * 1/1997 Fidalgo ....................... 257/679
5,671,525 A * 9/1997 Fidalgo ........................ 29/600
5,946,198 A    8/1999 Hoppe et al.
6,429,385 B1 * 8/2002 Tandy ........................ 174/260
6,459,588 B1 * 10/2002 Morizumi .................... 361/737

FOREIGN PATENT DOCUMENTS

| EP | WO 97 42598 A | 11/1997 |
| EP | 0992940 A2 * | 4/2000 |
| EP | 0 992 940 A | 4/2000 |
| JP | 2000105810 A * | 4/2000 |

* cited by examiner

Primary Examiner—A. Dexter Tugbang
Assistant Examiner—Alan M. Boswell
(74) Attorney, Agent, or Firm—Paul & Paul

(57) ABSTRACT

A non-contact type IC card includes a plane coil comprising a conductor line wound several times on substantially the same surface. The plane coil has respective terminals at the innermost and outermost ends. A semiconductor element has electrode terminals electrically connected to the terminals of the plane coil, respectively. A resin-filled portion is defined by a part of the circumference of the plane coil where spaces between adjacent loops of conductor line of the plane coil are filled with light-setting resin to maintain predetermined intervals between the adjacent conductors lines of the plane coil.

6 Claims, 8 Drawing Sheets

METHOD FOR MANUFACTURING A NON-CONTACT TYPE IC CARD

BACKGROUND OF THE INVENTION

1. Field of the Invention

The present invention relates to a non-contact type IC card and a method of manufacturing such a card. More particularly, the present invention relates to a non-contact type IC card using a plane coil in which a conductor is wound on substantially the same plane a plurality of times, and the terminals of the plane coil are electrically connected to the electrode terminals of a semiconductor element.

2. Description of the Related Art

As shown in FIG. 8, an IC card includes: a rectangular-shaped plane coil 100 in which a conductor wire 102 is wound a plurality of times; and a semiconductor element 104. The plane coil 100 and the semiconductor element 104 are interposed between two sheets of resin film 106 made of polyvinyl chloride (PVC) on which letters and other marks are printed. The two sheets of resin film 106 are made to adhere by an adhesive layer made of polyurethane resin. This adhesive layer seals the plane coil 100 and the semiconductor element 104.

When the thus formed IC card moves along a magnetic field formed by a card processor, electric power is generated by electromagnetic induction caused in the plane coil 100 of the IC card. Therefore, the semiconductor element 104 is started by the generated electric power, so that communication can be passed and received between the semiconductor element 104 of the IC card and the card processor via the plane coil 100 which functions as an antenna.

The plane coil 100 used for the above IC card is conventionally formed in such a manner that a covered electric wire is wound a plurality of times.

However, when the covered electric wire is wound so as to form the plane coil 100, it is difficult to reduce the manufacturing cost of the plane coil 100 and it is also difficult to mass-produce.

Therefore, a plane coil is formed by means of punching or etching a thin metal plate, by which the plane coil can be mass-produced at low cost as compared with a plane coil formed by winding a covered wire.

However, a plane coil made by etching or punching a thin metal plate has a drawback in that handling it is relatively difficult. More specifically, as shown in FIG. 9(*a*), when no external force is exerted on a plane coil made by etching or punching a thin metal plate, a predetermined interval is maintained between the adjacent loops of conductor 102 in the inside/outside direction of the plane coil 100. Contrary to this, as shown in FIG. 9(*b*), if a lateral external force F is exerted on the plane coil 100, the conductor 102 may be deformed and the adjacent loops of conductor may come into contact with each other, thereby causing a short circuit.

Such contact between adjacent loops of the conductor due to deformation thereof may occur if an external force is exerted on the plane coil during a manufacturing process of the IC card, such as when the plane coil 100 is transported from place to place or received in some place, or if an external force caused by flow of adhesive acts laterally on the conductor 102 when the plane coil is adhered to a resin film provided on one surface thereof with an adhesive.

In order to prevent such electrical contact between adjacent loops of the conductor due to deformation thereof and to manufacture an IC card, the inventors of this application have proposed to use an improved IC card lead frame in a manufacturing process of an IC card.

The improved lead frame for an IC card is made by etching or punching a thin metal sheet, in such a manner that each plane coil is partially connected with the inside frame and the outside frame which are respectively formed inside and outside, leaving a predetermined interval between the plane coil and the inside and outside frames. Specifically, the support sections extending from a plurality of positions of the inside edge of the outside frame are respectively connected with the outermost conductor of the plane coil, and the support sections extending from a plurality of positions of the outside edge of the inside frame are respectively connected with the innermost conductor of the plane coil.

The plane coil is substantially rectangular. In order to enhance the rigidity of the plane coil, there are provided bent sections in each straight line section of the plane coil. Further, in order to integrate the conductors on the circumference of the plane coil into one body so as to prevent the conductors from breaking up, the conductors on the circumference, which are adjacent to each other, are connected with each other by the connecting pieces, which are arranged at a plurality of positions.

When the plane coil is separated from the inside frame and the outside frame, the support sections are cut off, as are the connecting pieces. After they have been cut off from the plane coil, the conductors on the circumference of the plane coil tend to break up. Therefore, in order to prevent the conductors on the circumference from breaking up, a plurality of tape members are made to adhere to the plane coil. In this connection, the plane coil to which the plurality of tape members are made to adhere is electrically connected with the electrode terminal of the semiconductor element and the terminal of the plane coil.

In this case, when the plane coil is separated from the inside frame and the outside frame, even if the support sections and connecting pieces are cut off, the conductors of the plane coil are fixed by the tape members. Therefore, the conductors on the circumference can be prevented from breaking up. Accordingly, the plane coil can be handled more easily.

However, it has been found that since the tape members are only adhered to the surfaces of the conductors of the plane coil, the IC card, made by inserting the plane coil just separated from the inside frame and the outside frame, into a space between a pair of resin films made of, e.g. PCV, and characters or others are provided on a surface thereof, has a relatively high thickness.

On the other hand, in the above-mentioned lead frame for an IC card, as shown in FIGS. 10(*a*) and 10(*b*), a semiconductor element 216 is mounted on a recessed portion 220 formed on the lower surfaces of the conductors 203 of the respective circumferences of the plane coil 202. The electrode terminals 216*a* and 216*a* of the semiconductor element 216 are electrically connected to the respective terminals 205, 205 of the conductor 203 by means of wires 218, 218, respectively. If the top portions of the loops of the wires 218, 218 protrude upward from the region of the conductor 203, the thickness of the final product of the IC card would be increased. Therefore, it is necessary to arrange the wires 218, 218 so as not to protrude from the loops of the wires 218f 218. Thus, there is a limit to reducing the thickness of the IC card.

On the other hand, in the case where the plane coil is formed by etching or punching a thin metal sheet, if the thickness of the metal sheet to which etching or punching is applied is reduced, the etching or punching operation is made easier.

SUMMARY OF THE INVENTION

An object of the present invention is to provide a non-contact type IC card and a method of manufacturing such a card.

According to the present invention, there is provided a non-contact type IC card comprising: a plane coil comprising a conductor line wound several times on a substantially the same surface, the plane coil having respective terminals at innermost and outermost ends; a semiconductor element having electrode terminals electrically connected to the terminals of the plane coil, respectively; and a resin-filled portion defined by at least a part of circumference of the plane coil where spaces between adjacent conductors of the plane coil are filled with light-setting resin to maintain predetermined intervals between the adjacent conductors of the plane coil.

The spaces between the adjacent conductors are filled with light-setting resin so as not to protrude from upper and lower surfaces, respectively, of the plane coil.

The plane coil is formed by punching or etching a thin metal plate in such a manner that a conductor line is wound several times on substantially the same surface.

According to another aspect of the present invention, there is provided a method of manufacturing a non-contact type IC card, comprising the following steps of:

forming a plane coil by punching or etching a thin metal plate in such a manner that a conductor line is wound several times on substantially the same surface, the plane coil having respective terminals at innermost and outermost ends, and adjacent loops of conductor line are connected to each other at predetermined positions by connecting pieces;

filling spaces between adjacent loops of conductor of the plane coil are filled with a light-setting resin to maintain predetermined intervals between the adjacent loops of conductors of the plane coil; and removing the connecting pieces from the plane coil.

The space between adjacent loops of conductors are filled with light-setting resin so as not to protrude from upper and lower surfaces, respectively, of the plane coil.

The spaces between adjacent loops of conductor of the plane coil are filled with a light-setting resin at positions other than the positions of the connecting pieces.

The method of manufacturing a non-contact type IC card further comprises the following steps of:

forming a plane coil by punching or etching a thin metal plate in such a manner that a conductor line is wound several times on substantially the same surface, the plane coil having respective terminals at innermost and outermost ends, one of the terminals having a frame in which an accommodation hole is provided; and placing a semiconductor element having electrode terminals in the accommodation hole and electrically connecting the electrode terminals of the semiconductor element to the terminals of the plane coil.

The plane coil is provided at the innermost terminal thereof with the frame extending toward the inside of the plane coil, and the semiconductor element is accommodated in the accommodation hole of the frame of the innermost terminal.

The electrode terminals of the semiconductor element are electrically connected to the terminals of the plane coil, respectively, by means of wiring pattern which is formed on a surface of an insulating resin film.

DETAILED DESCRIPTION OF THE PREFERRED EMBODIMENTS

Figure 1:
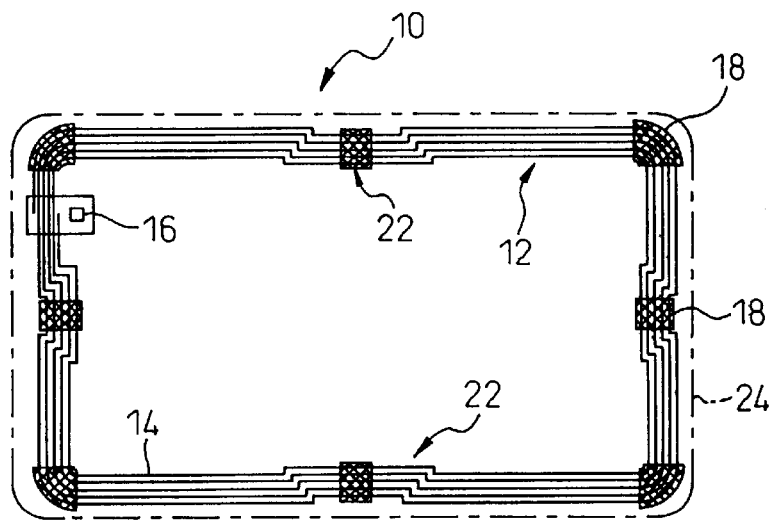
FIG. 1 is a plan view showing a non-contact type IC card of the present invention.

FIG. 1 is a view showing an example of a non-contact type IC card of the present invention. The plane coil 12 forming the antenna 10 for a non-contact type IC card shown in FIG. 1, the plane profile of which is substantially rectangular, formed by etching or punching a thin metal sheet. The plane coil 12 is formed of a conductor 14 which is wound on a substantially the same plane a plurality of times.

Thus, the plane coil 12 has four corners and four straight line sections (sides).

Figure 2A:
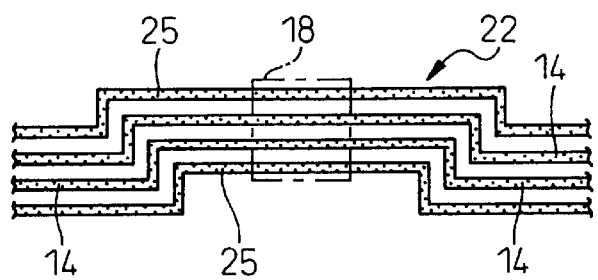
FIG. 2(a) is a partially enlarged view of a plane coil of the IC card shown in FIG. 1

The plane coil 12 shown in FIG. 1 is provided with bent sections 22 in the respective four straight line sections. As shown in FIG. 2(a), each of these bent sections 22 is formed in such a manner that the bent portion 25, which protrudes inward of the plane coil 12, is formed at substantially the same position of the conductor 14 on each circumference composing the straight line section of the plane coil 12. When this bent section 22 is formed on the plane coil 12, its rigidity is enhanced. Therefore, even if the plane coil 12 is subjected to an external force in the lateral direction it is being conveyed, it is possible to prevent deformation of the conductors 14 composing the plane coil 12, so that occurrence of a short circuit, caused by contact with adjacent conductors, can be prevented.

Figure 2B:
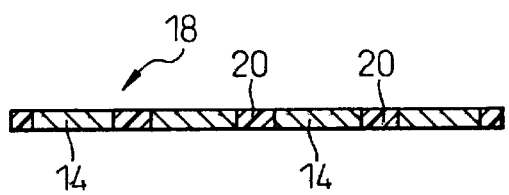
FIG. 2(b) is an enlarged cross-sectional view of FIG. 2(a)

In the intermediate section of each bent section 22 and in each corner section, there is provided a resin charging section 18 so that the conductors 14, 14 . . . on the circumference can be kept in its wound state while maintaining a predetermined interval between the adjoining conductors 14. As shown in FIG. 2(b), in this resin charging section 18, the resin 20 is charged between the conductors which are adjacent to each other, so that the conductors 14, 14 . . . can be secured by the resin 20.

The resin 20 is charged between the conductors without protruding from the upper and the lower face of the plane coil 12. As described later, the resin 20 adheres to two sheets of resin films, between which the plane coil 12 is interposed.

Therefore, the thickness of the adhesive layer for hermetically sealing the plane coil 12 can be reduced. Accordingly, the finally obtained IC card is thin.

For the resin 20, as described later, it is possible to use resin capable of being hardened or solidified after it has been charged between the conductors. It is preferable to use a light-setting type resin, because when it is charged between the conductors, it is possible to harden it by irradiating beams of light of a specific wave-length, without heating it. Therefore, it is possible to avoid an adverse influence such as the conductors 14, made of metal, being subjected to thermal shock if the resin were heated for hardening.

In this connection, it is also preferable to use biodegradation resin such as corn starch as the resin 20, so that the impact on the natural environment is reduced.

Figure 3A:
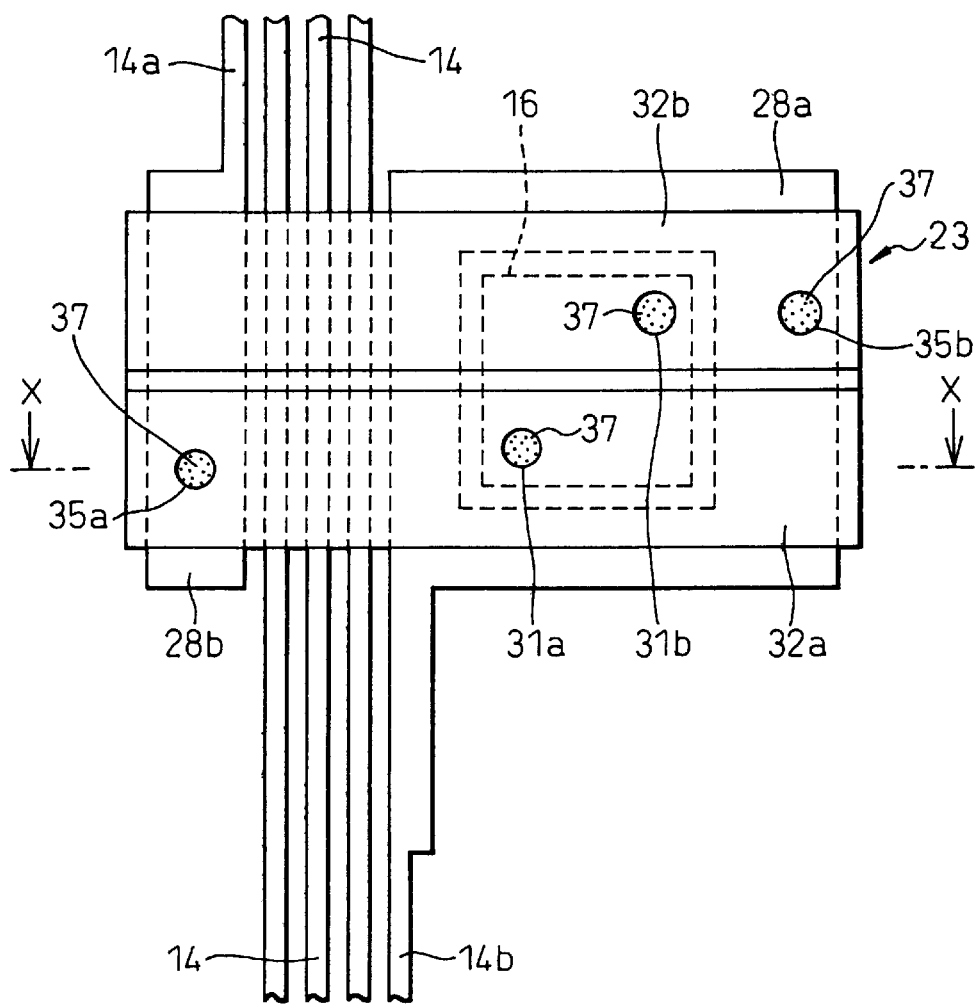
FIGS. 3(a) and 3(b) are respectively a partial back view and a partial cross-sectional view for explaining an electrical connection between terminals of a plane coil of the IC card shown in FIG. 1 and an electrode terminal of a semiconductor element.
Figure 3B:
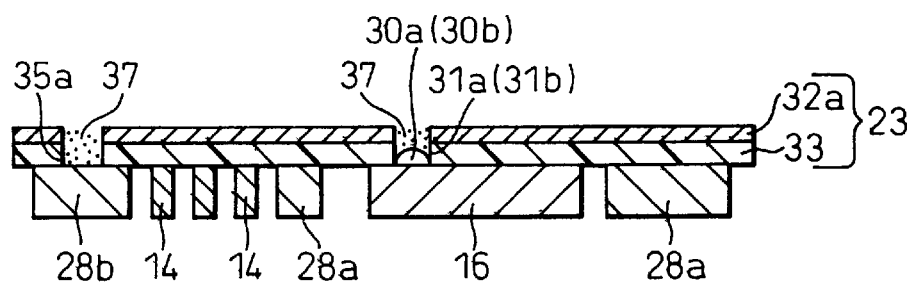

In the IC card 10 shown in FIG. 1, the terminals of the plane coil 12 and the electrode terminals of the semiconductor element 16 are electrically connected with each other as shown in FIGS. 3(a) and 3(b).

Specifically, the pattern film 23 is made to adhere to one side of the frame body 28a, which is the terminal of the innermost conductor 14b of the plane coil 12, protruding into the inner space side of the plane coil 12, and of the terminal 28b of the outermost conductor 14a of the plane coil 12. As shown in FIG. 3(b), which is a cross-sectional view taken along line X—X in FIG. 4(a), on the wiring pattern film 23, there are provided two wiring patterns 32a, 32b on the insulating resin film 33 made of adhesive resin.

In a portion of the wiring pattern film 23 in which the wiring pattern 32a is formed, there is provided a hole 31a into which the bump 30a, which is an electrode terminal of the semiconductor element 16 arranged at the center of the opening section of the frame body 28a, is inserted, and there is also provided a hole 35a, on the bottom face of which the surface of the terminal 28b of the plane coil 12 is exposed.

In a portion in which the wiring pattern 32b is formed, there is provided a hole 31b into which the bump 30b, which is an electrode terminal of the semiconductor element 16 arranged at the center of the opening section of the frame body 28a, is inserted, and there is also provided a hole 35b, on the bottom face of which the surface of the frame body 28a is exposed.

When the conductive paste 37 is charged into the holes 31a, 31b, 35a, 35b, the terminals of the plane coil 12 and the electrode terminals of the semiconductor element 16 are electrically connected with each other, respectively. When the wiring patterns 32a, 32b are removed and the conductive paste is coated or printing is conducted on the insulating resin film 33, the terminals of the plane coil 12 and the electrode terminals of the semiconductor elements 16 can be electrically connected with each other.

Figure 10A:
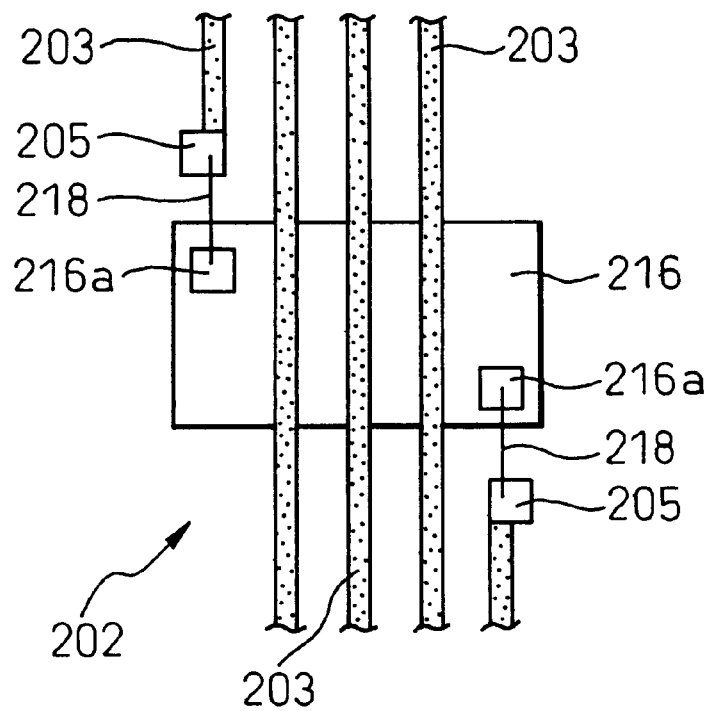
FIGS. 10(a) and 10(b) are respectively partially enlarged plan and cross-sectional views of a conventional IC card.
Figure 10B:
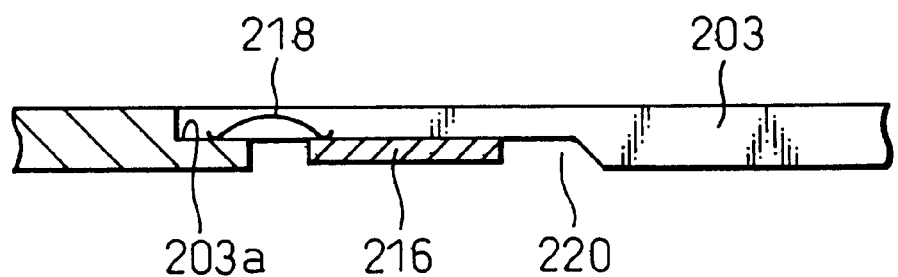

When the terminals of the plane coil 12 and the electrode terminals of the semiconductor element 16 are electrically connected with each other by the wiring patterns 32a, 32b formed on the other side of the wiring pattern film 23 as described above, the terminal of the plane coil 12 and the electrode terminal of the semiconductor element 16 can be electrically connected with each other with ease and the finally obtained IC card 10 is thin, as compared with a case in which the semiconductor element 216 is arranged in the recess 220 formed on the lower side of the conductors 203, 203 . . . the circumference of the plane coil 202 as shown in FIG. 10, and the electrode terminals 216a, 216a of the semiconductor element 216 and the terminals 205, 205 of the conductor 203 are electrically connected with each other by the wires 218, 218.

Figure 4:
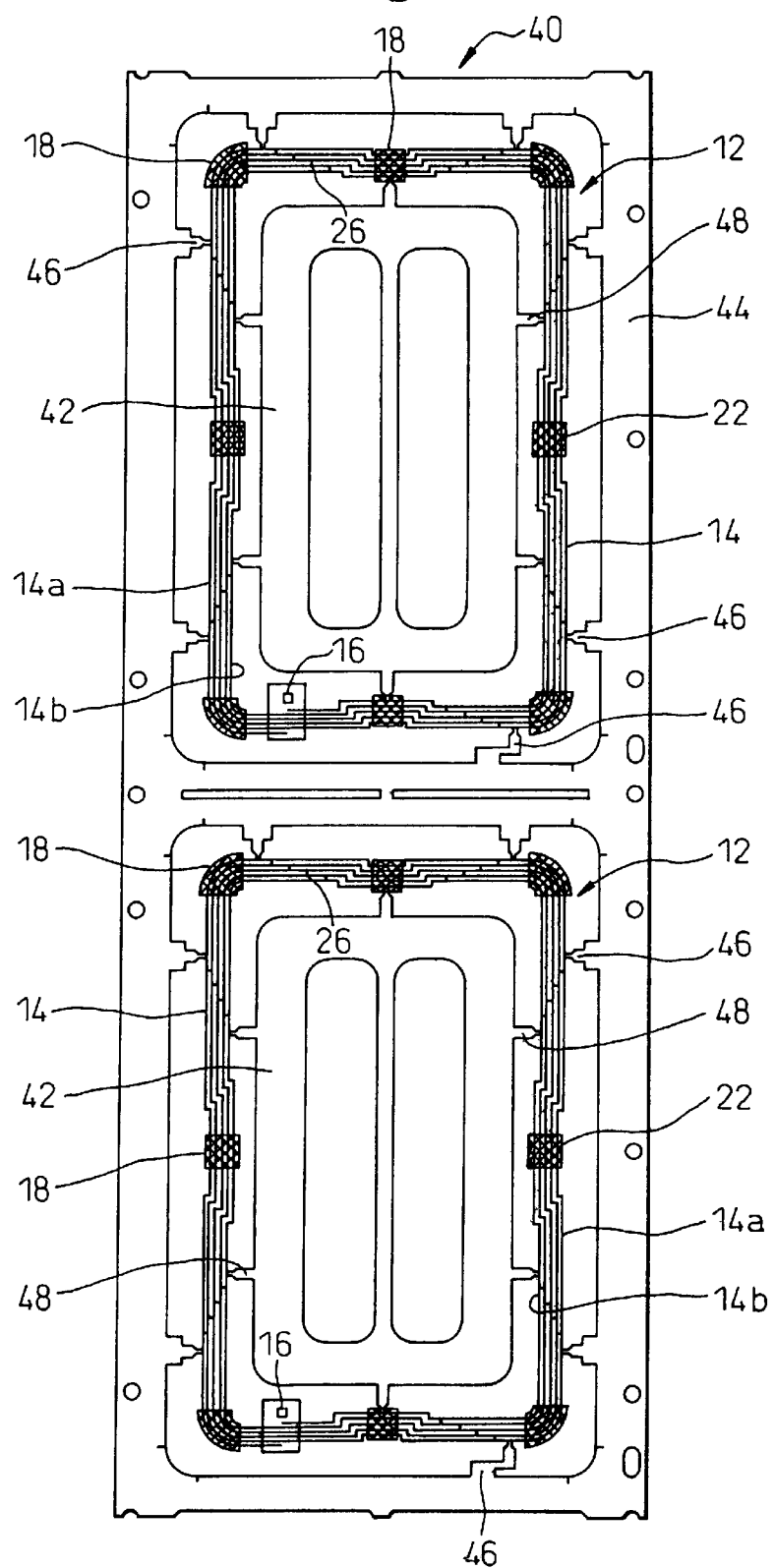
FIG. 4 is a plan view showing a frame for an IC card used when a non-contact type IC card shown in FIG. 1 is manufactured.

It is preferable that the non-contact type IC card 10 shown in FIG. 1 be manufactured via an IC card frame 40 shown in FIG. 4, which is made by etching or punching a thin metal sheet. Each plane coil 12, 12 is partially connected with the inside frame 42 and the outside frame 44 which are respectively formed inside and outside leaving a predetermined interval between the plane coil and the inside and outside frames. More specifically, the support sections 46, 46 . . . extending from a plurality of positions on the inside edge of the outside frame 44 are respectively connected with the outermost conductor 14a of the plane coil 12, and the support sections 48, 48 . . . extending from a plurality of positions of the outside edge of the inside frame 42 are respectively connected with the innermost conductor 14b of the plane coil 12.

In the case of the IC card frame 40 shown in FIG. 4, when the plane coil 12 and the frame, which is formed leaving predetermined intervals, are partially connected with each other so that the plane coil 12 is supported by the frame, this result in enhanced handling properties on the part of the plane coil when it is being conveyed or received.

The metal sheet to be etched or punched in the manner described above may be made of metal such as copper, iron and aluminum or an alloy of anyone of the above metal or metals. In particular, when a metal sheet made of iron or aluminum is used, the manufacturing cost of the plane coil can be reduced.

In this connection, on the plane coil 12 of the IC card frame 40 shown in FIG. 4, the electrode terminals of the mounted semiconductor element 16 and the terminals of the plane coil 12 are electrically connected with each other. However, since the details of the electrical connection between them have already been explained with reference to FIGS. 3(a) and 3(b), therefore explanation will be omitted here.

Figure 5A:
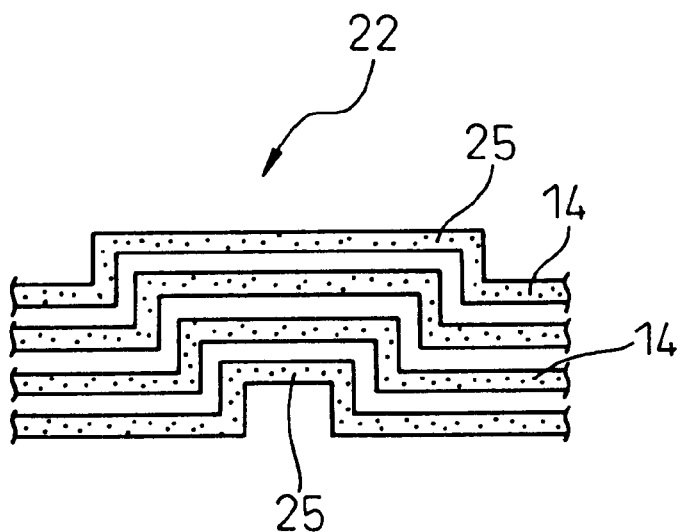
FIGS. 5(a) and 5(b) are partial plan views of the frame for an IC card shown in FIG. 5.

The plane coil 12 formed in the IC card frame 40 shown in FIG. 4 is rectangular. On this plane coil 12 formed in the IC card frame 40, there is provided a bent section 22 in each straight line section. As shown in FIG. 5(a), the bent section 22 is formed in such a manner that the bent portion 25, which protrudes inward of the plane coil 12, is formed at substantially the same position of the conductor 14 on each circumference composing the straight section of the plane coil 12. When the bent section 22 is formed on the plane coil 12, its rigidity is enhanced. Therefore, even if the plane coil 12 is subjected to an external force in the lateral direction when it is being conveyed, deformation of the conductors 14 composing the plane coil 12 can be prevented, so that the occurrence of short circuits, caused by contact between conductors, is prevented.

When a metal sheet is subjected to punching so as to form the plane coil 12, the punch used for punching out intervals between the conductors on the circumference composing the plane coil must be long and slender, and therefore the rigidity of the punch may be decreased. For the above reasons, there is a possibility that the punch will be damaged in the process of punching and the thus formed conductor may be twisted. In order to avoid this problem, when the bent portion 25 is formed in each conductor 14, a bent portion must also be formed in the punch in accordance with the profile of the conductor 14. Due to the foregoing, the rigidity of the punch can be enhanced. Therefore, it is possible to prevent the punch from being damaged in the process of punching, and to prevent the conductors 14 from being twisted.

Figure 5B:
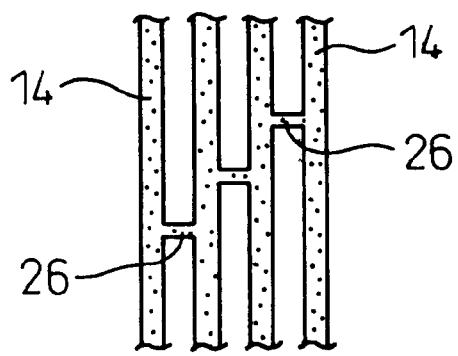

On the plane coil 12 shown in FIG. 4, there are provided a plurality of connecting pieces 26 for connecting the conductors 14 on the circumference, which are adjacent to each other, as shown in FIG. 5(b). By provision of the connecting pieces 26, 26 . . . , the conductors 14 on the circumference can be prevented from breaking up. Therefore, when a plurality of frames 40 used for IC cards are stacked, it is possible to prevent deformation of the conductors 14, which can occur if the conductors 14 of one plane coil 12 become entangled with the conductors 14 of another plane coil 12.

When the connecting pieces 26, 26 . . . are formed step-like between the conductors 14 on the circumference as shown in FIG. 5(b), it is easy to perform punching on the connecting pieces 26, 26 . . . by using a punch. Further, it becomes possible to enhance the mechanical strength of the punch. The reason why the mechanical strength of the punch is enhanced is described as follows. Usually, the connecting pieces 26, 26 . . . are simultaneously cut off. Therefore, when the connecting pieces 26, 26 . . . are arranged on a straight line, the cutting punch is formed into a comb-tooth-shape. Accordingly, it is difficult to make the cutting punch, and the mechanical strength of the cutting punch is decreased. However, when the connecting pieces 26, 26 . . . are formed step-like as shown in FIG. 5(b), the position of each punch blade for cutting can be shifted according to the positions at which the connecting pieces 26, 26 . . . are formed. Therefore, the cutting punch can be easily made, and the mechanical strength of the cutting punch can be enhanced.

In this connection, the connecting pieces 26, 26 . . . are cut off at the sealing process for sealing the plane coil 12 described later, so that a predetermined interval is formed between the conductors 14 on the circumference.

In the case of the IC card frame 40 shown in FIG. 4, when the IC card 10 is formed by interposing the plane coil 12 between two sheets of resin films 24, 24, it is necessary to cut off the support sections 46, 46 . . . and 48, 48 . . . and the connecting pieces 26, 26 . . . so as to separate the plane coil 12 from the IC card frame 40, i.e. from the inside frame 48 and the outside frame 44.

On the simplified plane coil 12, which has been simplified when it is cut off from the IC card frame 40, the bent sections 22, 22 . . . are formed. Although the rigidity of the simplified plane coil 12 is increased, it is impossible to sufficiently prevent the conductors 14 from breaking up.

In order to sufficiently prevent the conductors 14 from breaking up, in the IC card frame 40 shown in FIG. 4, the resin charging sections 18, 18 . . . are formed in the intermediate sections of the bent sections 22, 22 . . . and the corner sections. As shown in FIG. 2(b), the resin charging sections 18 are solidified and the resin 20 does not protrude from the upper and the lower faces of the plane coil 12.

Figure 6A:
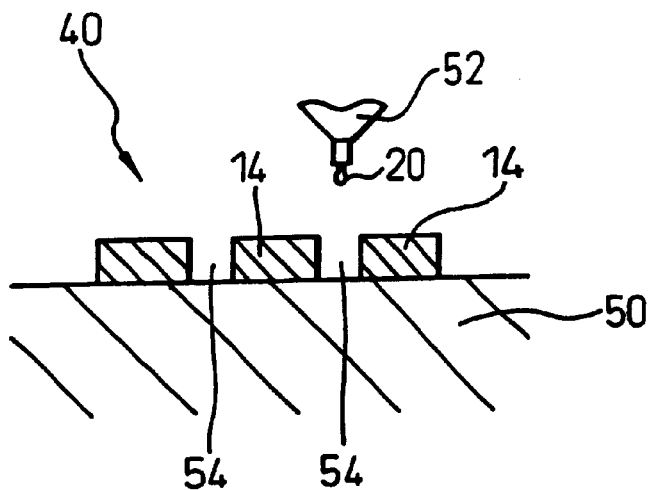
FIGS. 6(a) to 6(c) are schematic illustrations for explaining a method of charging resin between conductors of a plane coil of the frame for an IC card shown in FIG. 4.
Figure 6B:
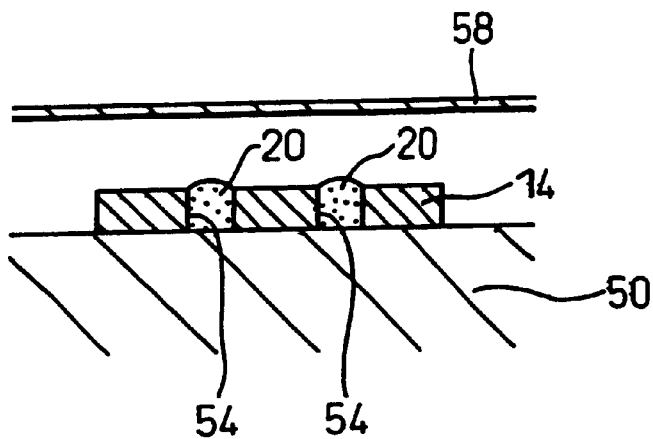
Figure 6C:
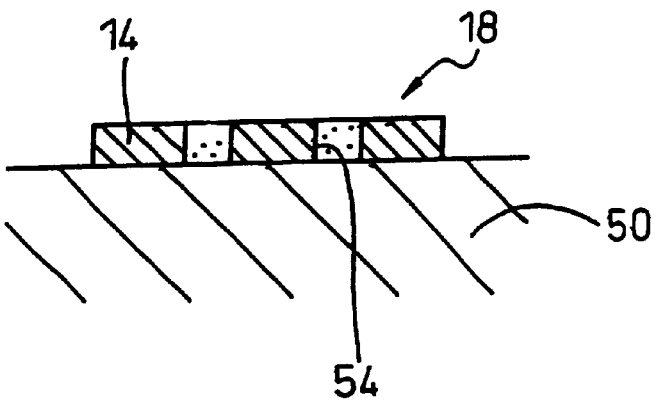

In order to form a resin charging section 18 which is solidified, with the resin 20 not protruding from the upper and lower faces of the plane coil 12, as shown in FIG. 6(a), the lower face side of the frame 40 for an IC card is placed on the flat table 50, and the fluid resin 20 is poured between the conductors 54, 54 . . . at predetermined positions on the plane coil 12 by a dispenser 52. The resin 20 which has been poured into the spaces between the conductors 54, 54 . . . , swells from the upper face of the plane coil 12 by surface tension, as shown in FIG. 6(b). In this case, after the film 58 has covered the upper face of the plane coil 12 as shown in FIG. 6(b), so that the upper face of the resin 20 can be made to be the same as that of the plane coil 12, the resin 20 is solidified or hardened.

When the resin 20 is solidified or hardened as described above, it does not protrude from the upper and the lower face of the plane coil 12.

Examples of the usable resin 20 are: thermoplastic resin, thermo-setting resin and light-setting resin. It is most preferable that the resin 20 be a light-setting type resin, because, as explained earlier, it is possible to harden it by irradiating beams of light of a specific wave-length without heating it, and thereby, avoid subjecting the plane coil to thermal shock.

When light-setting resin is used as the resin 20, the plane coil 12 has been covered with after the film 58 and the upper face of the resin 20 has been regulated to be the same level as that of the plane coil 12 as shown in FIG. 6(b). It is preferable that a transparent film is used as the film 58 and beams of light are irradiated through the transparent film when the resin 20 is hardened.

Formation of the resin charging section 18 may be conducted at any time before the plane coil 12 is separated from the IC card frame 40. However, it is preferable that the resin charging section 18 be formed after the semiconductor element 16 has been mounted and before the plane coil 12 is separated from the frame 40.

However, in the case where light-setting resin is used as the resin 20 and there is a possibility that the semiconductor element 16 will be damaged by ultraviolet rays used for hardening the resin, it is preferable that the semiconductor element 16 to mount after the resin charging section 18 made of light-setting resin has been formed.

In this connection, the resin 20 should be prevented from being protruded from the upper and the lower face of the plane coil 12 when the resin 20 is solidified or hardened. However, the surface of the resin 20, which has been contracted to be solidified or hardened, may be permissible even if it is formed into a concave.

Even after the support sections 46, 46 . . . , 48, 48 . . . and the connecting pieces 26, 26 . . . of the IC card frame 40 shown in FIG. 4 are cut off so that the simplified plane coil 12, on which the semiconductor element 16 is mounted, is separated from the IC card frame 40, the plane coil 12 (which is also referred to simplified plane coil) is still provided with the bent sections 22, 22 . . . and the resin charging sections 18, 18 . . . Therefore, the conductors 14 can be prevented from breaking up or being deformed.

In order to make an IC card from such a simplified plane coil 12, it is necessary to adhere protective films on the both surfaces of the plane coil 12. Any characters or information can be printed on these protective films in advance. When these protective films are adhered to the plane coil 12, the conductors 14 of the plane coil 12 can also be prevented from breaking up or being deformed.

The protective film can be made of polyethylene terephthalate (PET) film or polyvinyl chloride (PCV) film.

Figure 7:
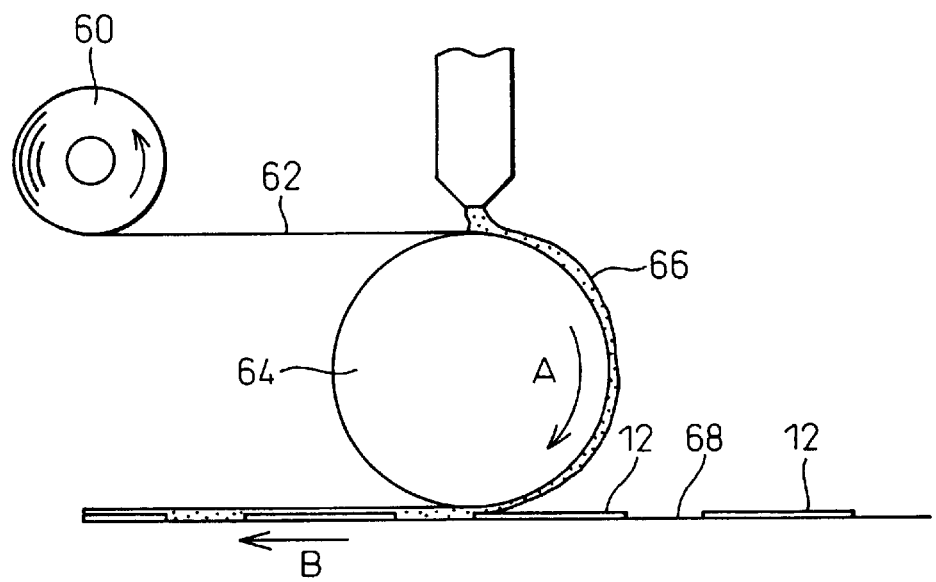
FIG. 7 is a schematic illustration for explaining an adhesion device for making a film adhere to a simplified plane coil.
Figure 8:
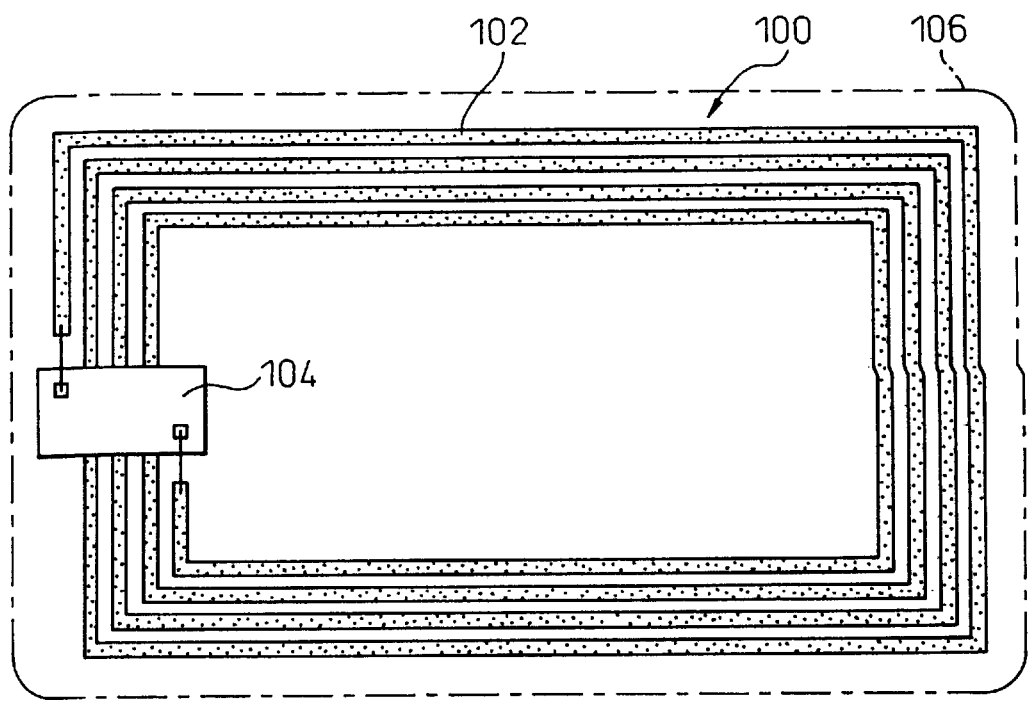
FIG. 8 is a plane view for explaining a conventional IC card.
Figure 9A:
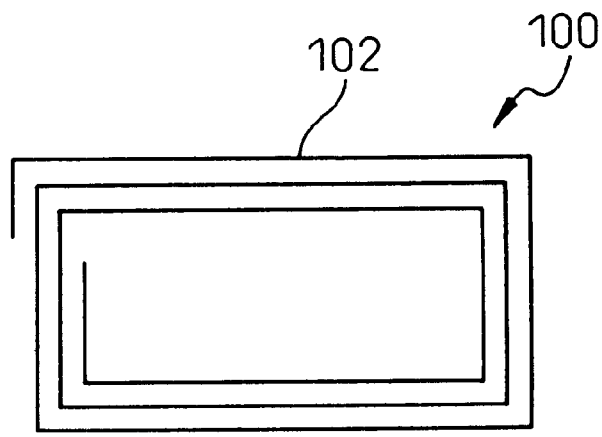
FIGS. 9(a) and 9(b) are respectively plan views of a plane coil for a conventional IC card frame.
Figure 9B:
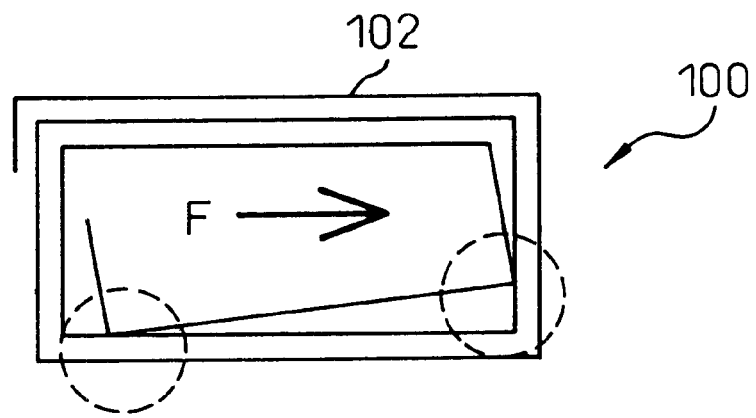

In this connection, in the process shown in FIG. 7, IC cards are formed when protective films, on which printing can be conducted, are made to adhere to both faces of the plane coil 12.

In the process shown in FIG. 7, while the film 62 made of polyethylene terephthalate (PET) or polyvinyl chloride (PVC), which has been drawn out from the roll 60, is being wound around a half circumference of the drum 64 rotating in the direction of arrow A, the hot-melt resin 66, which is heated and provided with an adhesion property, is coated on one side (surface side) of the film 62 made of PET or PVC. On the other hand, the plane coils 12, 12 . . . are placed on the conveyer 68 moving in the direction of arrow B. When the plane coils 12, 12 . . . pass below the drum 64, the PET film 62 is made to adhere to one side of each plane coil by the hot-melt resin 66 which exhibits an adhesion property when it is heated. Further, the plane coil 12, on one side of which the PET film 62 is already made to adhere by the hot-melt adhesive agent 66, is placed on the conveyer 68 in such a manner that the other side of the plane coil 12, on which the PET film 62 has not yet adhered, is set upward. Then, the PET film 62 is made to adhere to the other side of the plane coil 12 by the hot-melt adhesive agent 66. In this way, the PET films 62 can be made to adhere to both sides of the plane coil 12.

When the plane coils 12 are cut off at appropriate positions, on both sides of which the PET films 62 are made to adhere, it is possible to obtain IC cards as shown in FIG. 1.

In the explanations of the embodiments shown in FIGS. 1 to 7, the resin 20 for fixing the conductors 14 of the plane coil 12 is applied the spaces between the conductors 14 only at predetermined positions. However, the resin 20 can also be applied to the spaces between the conductors 14 in the whole area of the plane coil 12. In this case, oxidization of the plane coil 12 can advantageously be prevented.

In addition, in the embodiment of FIG. 4, although the semiconductor element 16 is mounted on the plane coil 12 before the inside frame 21 is cut off from the plane coil 12, the semiconductor element 16 can be mounted on the plane coil 12 after the inside frame 21 is removed.

As mentioned above, according to the present invention, the resin 20 is charged in the spaces between the conductors 14 so as not to protrude from the upper and lower surfaces of the plane coil 12 and then is solidified to fix the plane coil 12. Therefore, no substance protrudes from the upper and lower surfaces of the plane coil 12 and thus the thickness of the final product of the IC card is reduced. Therefore, the IC card obtained as mentioned above can easily be handled together with other thin cards.

In addition, during the manufacturing process of the IC card, the plane coil can easily be handed, since the plane coil is prevented from breaking up and further the conductors can be prevented from being deformed.

What is claimed is:

1. A method for manufacturing a non-contact type IC card, said method comprising the following steps of: forming a plane coil by punching or etching a thin metal plate in such a manner that a conductor line is wound several times on substantially the same surface, said plane coil having respective terminals at innermost and outermost ends, and adjacent loops of conductor line are connected to each other at predetermined positions by connecting pieces; filling spaces between adjacent loops of conductor of the plane coil are filled with a resin to maintain predetermined intervals between said adjacent loops of conductor of the plane coil; and removing said connecting pieces from the plane coil; wherein said spaces between adjacent conductor lines are filled with resin so as not to protrude from upper and lower surfaces, respectively, of the plane coil.

2. A method as set forth in claim 1, wherein said spaces between adjacent conductor lines of the plane coil are filled with a resin at positions other than positions of said connecting pieces.

3. A method as set forth in claim 1 further comprising a step of:

forming a plane coil by punching or etching a thin metal plate in such a manner that a conductor line is wound several times on substantially the same surface, said plane coil having respective terminals at innermost and outermost ends, one of said terminals having a frame in which an accommodation hole is provided;

placing a semiconductor element having electrode terminals in said accommodation hole and electrically connecting said electrode terminals of the semiconductor element to said terminals of the plane coil.

4. A method as set forth in claim 3, wherein said plane coil is provided at the innermost terminal thereof with said frame extending toward an inside of the plane coil, and the semiconductor element is accommodated in said accommodation hole of the frame of the innermost terminal.

5. A method as set forth in claim 4, wherein said electrode terminals of the semiconductor element are electrically connected to said terminals of the plane coil, respectively, by means of wiring pattern which is formed on a surface of an insulating resin film.

6. A method as set forth in claim 1, wherein said resin is light-setting resin.

* * * * *